United States Patent [19]
Hsiue et al.

[11] Patent Number: 4,623,577
[45] Date of Patent: Nov. 18, 1986

[54] CIRCUIT BOARD MADE FROM CROSS-LINKED POLYCYANURATE POLYMER, THERMOPLASTIC POLYMER AND POLYARAMID FIBER

[75] Inventors: Eric S. Hsiue, Parsippany; Daniel Ziatyk, Denville; George R. Stone, Hopatcong; Bruce T. DeBona, Madison, all of N.J.

[73] Assignee: Allied Corporation, Morris Township, Morris County, N.J.

[21] Appl. No.: 697,359

[22] Filed: Feb. 1, 1985

[51] Int. Cl.$^4$ ............................................. B65D 85/00
[52] U.S. Cl. .................................. 428/209; 428/422.8; 428/252; 428/287; 428/901; 428/902
[58] Field of Search ..................... 428/252, 287, 422.8, 428/901, 902, 209; 525/439

[56] References Cited

U.S. PATENT DOCUMENTS

| | | | |
|---|---|---|---|
| 3,737,352 | 6/1973 | Avis et al. | 156/181 |
| 3,939,024 | 2/1976 | Hoggatt | 428/252 X |
| 4,157,360 | 6/1979 | Prevorsek et al. | 428/458 |
| 4,444,309 | 4/1984 | Morton | 206/328 |
| 4,446,191 | 5/1984 | Miyadera et al. | 428/252 X |
| 4,458,412 | 7/1984 | Dean et al. | 29/705 |
| 4,489,365 | 12/1984 | Daberkoe | 361/403 |
| 4,513,055 | 4/1985 | Leibowitz | 428/901 X |

FOREIGN PATENT DOCUMENTS 165451 8/1982 Japan.

OTHER PUBLICATIONS

Ser. No. 463,798, by Palley et al.
Packard, Kevlar Epoxy Substrate for Interconnecting Leadless Chip Carrier, Sampe Journal, Jan./Feb. 1984.
G. Lubin, ed., Handbook of Composites, Shilbey, Filament Winding; pp. 449, 458–459, 467 (1982).
G. Lubin, ed., Handbook of Composites, Goldsworthy, Continuous Manufacturing Processes, pp. 479–481, 488–489 (1980).

Primary Examiner—Nancy A. B. Swisher
Attorney, Agent, or Firm—Richard A. Negin

[57] ABSTRACT

The present invention is a circuit board having a substrate comprising a semi-IPN and at least one balanced polyaramid layer.

10 Claims, 2 Drawing Figures

CIRCUIT BOARD MADE FROM CROSS-LINKED POLYCYANURATE POLYMER, THERMOPLASTIC POLYMER AND POLYARAMID FIBER

DESCRIPTION

BACKGROUND OF THE INVENTION

The present invention is in the field of circuit boards; more particularly, the invention relates to an improved circuit board made of a cross-linked polycyanurate polymer, thermoplastic polymer, and polyaramid fiber.

As indicated in D. C. Packard, "KEVLAR ® Epoxy Substrate for Interconnecting Leadless Chip Carrier", SAMPE Journal, Vol. 20, No. 1, pp. 6–14 (January/February 1984), experimental circuit boards for interconnecting leadless chip carriers are disclosed to be made from composites of epoxy and polyaramid fibers (Kevlar).

Printed circuit board technology is well established for producing leaded insertion electronic component printed wiring assemblies. More recently, printed circuit boards have been developed for leadless chip carriers. Leadless chip carriers are well known in the art. An integrated circuit chip is carried by the leadless chip carrier. The combination of the chip and the carrier are interconnected to form proper circuits. U.S. Pat. No. 4,444,309 discloses a carrier for a leadless integrated circuit chip.

The development of the leadless chip carriers has enabled printed circuit boards to have much higher component densities. The package can now have electrical connections on all sides of the chip carrier and there is the elimination of space required to component leads.

In the past, in microcircuit applications used flat packs or dual in line packages. The differential thermal expansion between the microcircuit package and the board/substrate was accommodated by flexibility in the device leads. The microcircuit package was of a ceramic material such as aluminia having a coefficient of thermal expansion of $+6.4 \times 10^{-6}$ cm/cm/°C. The flexibility to compensate for differential thermal expansion with the use of leadless chip carriers is not there since the device is soldered directly to the substrate material. As indicated in the referenced article by Packard, even minor differences in the coefficient of expansion of the substrate and the leadless chip carrier can result in micro-cracking in the resin of the fiber resin substrate composite.

SUMMARY OF THE INVENTION

The present invention is an improved circuit board which can preferably be used to form circuits with leadless integrated circuit chips carried on leadless chip carriers with resistance to microcracking in the resin of the circuit board substrate.

The circuit board of the present invention comprises a substrate and a conducting layer. The substrate comprises at least one polymeric layer which is a semi-interpenetrating network type system (Semi-IPN). The polymeric layer is made of the semi-IPN which is preferrably a cross-linked cyanurate polymer, a thermoplastic polymer having a Tg of greater than 80° C. and at least one balanced polyaramid fiber layer adhered to the polymeric layer. The substrate has a coefficient of thermal expansion of from 2.0 to $8.0 \times 10^{-6}$ cm/cm/°C., and preferrably from 6.0 to $7.0 \times 10^{-6}$ cm/cm/°C. The present invention includes the above-substrate interconnected typically by soldering with at least one leadless chip carrier.

In a preferred embodiment of the present invention the semi-IPN material is a cross linked aromatic dicyanate and a thermoplastic which is preferably a polyether sulfone or a poly(ester carbonate). The polyaramid component of the circuit board is a balanced polyaramid fibrous layer, which has uniform properties in at least two directions, preferably it is a non-woven fibrous layer or a cross-woven fibrous layer.

DESCRIPTION OF THE PREFERRED EMBODIMENTS

Figures 1, 2:
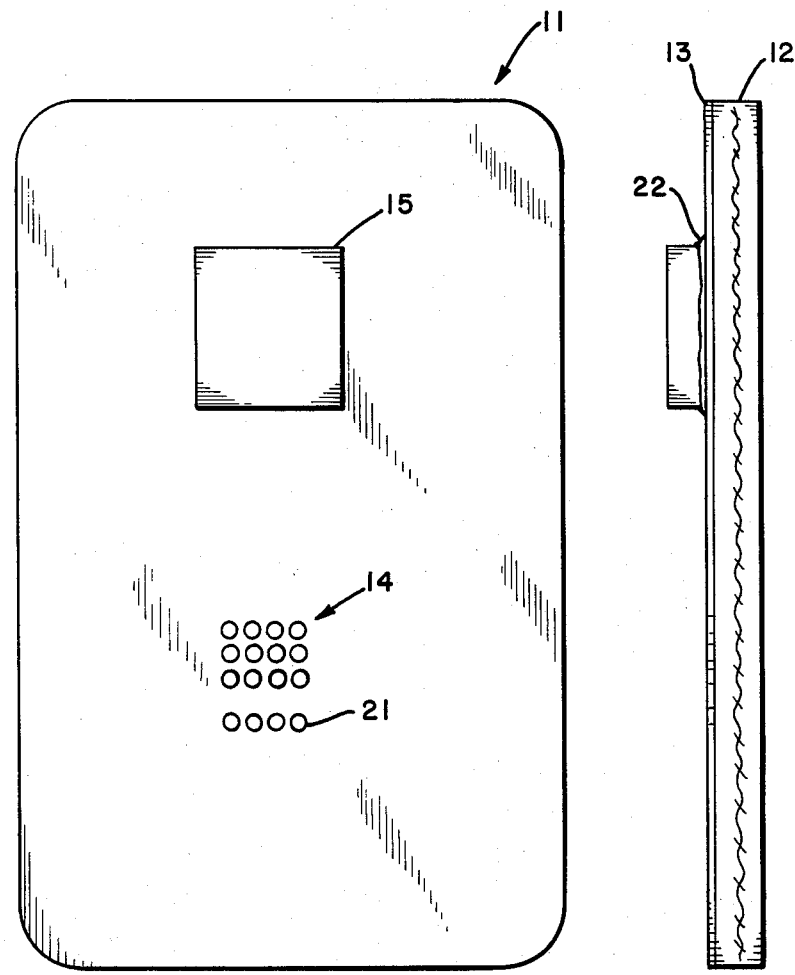
FIG. 1 is a top view of a circuit board of the present invention.
FIG. 2 is a side view of the circuit board of the present invention.

The present invention is an improved circuit board comprising a substrate comprising at least one polymeric layer comprising a cross-linked cyanurate polymer, a thermoplastic polymer having a Tg of greater than 80° C., and at least one balanced polyaramid fiber layer adhered to the polymeric layer. The substrate has a coefficient of thermal expansion of from 2.0 to $8.0 \times 10^{-6}$ cm/cm/°C. The substrate has at least one layer of conductive material. The conductive layer is typically formed, by etching, into a desired configuration useful to form a circuit.

The present invention will be understood by those skilled in the art by reference to FIGS. 1 and 2 which are a top and side view of a circuit board of the present invention. The circuit board is generally identified as reference character 11. The circuit board is made of a substrate 12 and at least one layer of conductive material 13. As shown in FIGS. 1 and 2, there is a leadless chip carrier location 14 which does not have a leadless chip connected to it. There is a leadless chip carrier 15 schematically shown which is connected to the circuit board 11. Although a one layer circuit board is shown, it is recognized that a plurality of layers can be connected together to form a desired circuit. Multi-layer boards can have up to 16 different layers with portions of the circuit on each layer.

The circuit board 11 of the present invention is made of a substrate 12. The substrate is comprised of a semi-IPN material. An Interpenetrating Polymer Network (IPN) is a combination of at least two polymers, at least one of which is synthesized or crosslinked in the immediate presence of the other. In a semi-IPN, there are at least two continuous phases with only one phase cross-linked. The other phase is typically a thermoplastic. The polymeric layer is preferably a semi-IPN made of a polycyanurate, referred to as a cross-linked cyanurate polymer, acting as a matrix in which a high molecular weight thermoplastic polymer is dispersed. This results in a compatible thermoformable composition possessing desirable characteristics of both thermoplastic and cross-linked polymer compositions. The preferred cyanurate polymer is an aromatic dicyanate compound represented by the formula NCO-R-OCN, wherein R is a divalent aromatic organic radical. Suitable aromatic dicyanate compounds are illustrated in U.S. Pat. Nos. 4,157,360 and 4,334,045 both hereby incorporated by reference. They include, especially, compounds of the above type wherein R is at least one aromatic moiety and contains 6–40 carbons, in which the aromatic rings may be further substituted by groups, inert during the polymerization, selected from halogen, alkyl or 1–4 carbons, alkoxy of 1–4 carbons and alkylcarboxylic ester of 1–4 carbons. Exemplary classes for R include diphenyl moiety, diphenyl ester moiety formed from aromatic dicarboxylic acid and diphenol; diphenyl carbonate moiety, formed from diphenol and carbonate precursor; diphenol ester carbonate moiety formed from aromatic dicarboxylic acid, diphenol and carbonate precursor; as well as mixtures thereof. Preferred moieties can be illustrated by the formula:

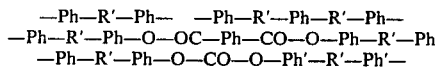

or mixtures thereof; wherein Ph is, independently at each occurrence, 1,4-phenylene or 1,3-phenylene and R' is, independently at each occurrence, 2,2-propylidene or 4,4-phthalein. Specially preferred aromatic dicyanate compounds include dicyanatobisphenol A, 4,4'-dicyanatobisphenol, either or these two tetra substituted in the positions ortho to the cyanato group by methyl. The most preferred aromactic dicyanato compound is dicyanatobisphenol A.

Other suitable dicyanates include those where R is dicumyl benzene, 4,4'-biphenyl, 1,4-naphthyl, or

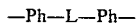

where Ph is 1,4-phenylene and L is —O—, —S—, —S(O)— or —SO$_2$—. In general, any aromatic compound with two phenolic hydroxies can be converted to a dicyanate and used in the present invention.

The second constituent of the polymeric layer is a thermoplastic polymer substantially miscible in the solid phase with the aromatic dicyanate compound and its isocyanurate oligomers and polymers. Exemplary classes of thermoplastic polymers which exhibit a high degree of solubility with the dicyanate include polyesters, polycarbonate and polyestercarbonates. Representative polymers of these classes include polyethylene terephthalate, polybutylene terephthalate, poly(bisphenol A carbonate), poly(bisphenol A carbonate/terephthalate), poly(bisphenol A/phenolphthalein carbonate/terephthalate). Suitable poly(ester carbonates) are described, for example, in U.S. Pat. Nos. 4,156,069 of Prevorsek & Keston (1979) and 4,310,652 of DeBona, et al. (1982) and published European Patent Application No. 27,844 (1981) of Prevorsek & DeBona corresponding to U.S. Ser. No. 133,227 (filed Mar. 24, 1980), all of which are incorporated herein by references. Other suitable thermoplastic polymers, which in general exhibit a lower degree of solubility, are polysulfones and poly(ether-sulfones). Representative polysulfones and polyether-sulfones include UDEL (a trademark of Union Carbide) and VICTREX (a trademark of ICI). The weight ratio of dicyanate to thermoplastic polymer in the coating solution is not critical to the present invention; however, a general range of between about 1:9 to about 9:1 is preferred, with ratios between about 4:1 and about 1:4 being more preferred and about 1:1 being most preferred.

The substrates are formed into a composite layer with polyaramid fibers. The polyaramid fibers can be in any suitable form. Included are chopped polyaramid as a filler dispersed in the semi-IPN matrix, and polyaramid in the form of woven or non-woven mats or layers. Preferably, the polyaramid fibers are aligned in more than one direction. Preferred polyaramid fibrous layers are non-woven mats and square-woven mats having balance of properties in at least 2 perpendicular directions in a plane parallel to the plane of the substrate.

The preferred polyaramid fibers useful in the fibrous layer of the substrate are polyaramid fibers produced as Kevlar ® fiber by the DuPont Company. The polyaramid fabric preferably is square-woven and has an areal density of from 1.0 to 3.0 ounces per yard square and most preferably 1.75 ounces per yard square. The substrate for the circuit board of the present invention made of the semi-IPN polymeric material and the polyaramid fiber preferably has a coefficient of thermal expansion of from 2.0 to $8.0 \times 10^{-6}$ cm/cm/°C., and more preferably from 6.0 to $7.0 \times 10^{-6}$ cm/cm/°C., with the most preferred coefficient of thermal expansion being about +6.4 pm per °C. The substrate should have a dielectric constant of preferably 2.0 to 5.0, more preferably 2.5 to 3.5 and most preferably about 3.0.

There is at least one layer of conductive material on at least one of the surfaces of the substrate. Typically, the conductive material is in a configuration useful to form an electrical circuit. The conductive layer can be adhered to the substrate by suitable means. A preferred means is to merely laminate a thin metallic conducting layer such as a copper layer to the substrate. The pressure of the lamination rolls should be sufficient to enable the copper layer to physically adhere to the substrate. A desired configuration suitable for use in a circuit can be formed by removing portions of the conductive layer at undesired locations by a suitable method such as etching . The formation of such configurations is well known in the art.

A typical circuit board of the present invention can have any dimensions suitable for its use. Typically the circuit boards are from 3 to 15 inches wide and 3 to 15 inches long. The thickness of the circuit board can be varied as desired and the amount and type of fiber including the number of layers can be varied as desired and required for particular use. In the preferred embodiment, the substrate has one layer of cross woven or non-woven polyaramid fibers coated with a semi-IPN material which is preferably a semi-IPN made from 50% by weight dicyanato-bisphenol A and 50% of a polyether sulfone such as poly[oxybis(1,4-phenylene)isopropylidene-oxy-bis(1,4-phenylene)sulfone] or a poly(ester carbonate) such as poly(bis phenyl carbonate/terephthalate (50/50)).

The fibrous layer can be in the form of a filler within the semi-IPN polymeric network. As indicated above, more preferably the polyaramid layer is a fibrous layer which can be woven or non-woven and is balanced. The polyaramid layer can be embedded in the polymeric layer or laminated to a polymeric layer. Preferably, the polyaramid layer is embedded in the polymeric layer by coating it with a semi-IPN solution tip.

The volatile solvent used in the coating the polyaramid layer should be one in which the aromatic dicyanate and thermoplastic polymer are soluble (usually limited by polymer solubility) and which does not catalyze or react with either. In the case of polycarbonates, poly(ester carbonates), polyesters, polysulfones and polyether-sulfones suitable solvents include chlorinated hydrocarbons (e.g. dichloromethane), N-substituted amides (e.g. DMF and NMP), ketones (e.g. cyclohexanone) and ethers (e.g. THF). Such solvents will also dissolve most if not all aromatic dicyanates used in the present invention. The term volatile is used in connection with the solvent to mean that it can be essentially completely removed from the coated fiber before complete or substantially complete cure of the aromatic dicyanate under reasonable conditions of vacuum and temperature during the drying step. An indication of the suitable volatility is an atomspheric boiling point of at no more than about 250° C., and preferably no more than about 150° C. The solvent should also wet the fiber (which may be a sized fiber). The total solids concentration (dicyanate and thermoplastic polymer) in the solution for the coating step is normally between the 5% and about 20%, depending upon the particular materials used. In the case of dicyanotobisphenol A and either a polycarbonate or poly(estercarbonate), the preferred solids content is between about 5% and about 20%, with between about 10% and about 16% being more preferred. The desired concentrations will depend on polymer solution and fiber velocity.

A catalyst may be present to increase the cure rate of the aromatic dicyanate. Effective catalysts include zinc salts (e.g. zinc chloride or zinc octoate), tertiary amines and various other metal halides, including those which are Lewis acids. The catalyst would normally be dissolved in the solvent with the aromatic dicyanate and thermoplastic, but in significantly lower amounts. It would cause polymerization (curing) only after the drying step was effectively complete.

The contact time for the coating step is usually not very long, with contact times of a few seconds or less being generally suitable. One convenient means of achieving this is to pass the continuous fiber web through the solution, generally from either a roll or from a sizing step and continuing to conduct the continuous fiber thereafter to the drying step.

The drying step can be conducted at ambient or above ambient temperatures, with either an inert gas or a vacuum used, but not required, to facilitate the removal of the volatile solvent. Combinations of high temperature and time sufficient to cause polymerization of the aromatic dicyanate to the gellation stage should be avoided. As a general matter, less than 50% of the free dicyanate groups present in the aligned and coated fiber arrangement should be reacted (so as to disappear as a separate peak in infrared) during the drying step.

In those forms of the invention wherein multifilament fibers (such as multifilament carbon fibers) are sized with a solution containing aromatic dicyanate, the process described above for the coating step should be followed with these exceptions. In sizing, the total solids content of the solution should normally be below 5%, is preferably between about 1 and about 2% when the sizing is aromatic dicyanate compound alone, and is preferably between about 1 and about 2 percent when the sizing contains both aromatic dicyanate compound and thermoplastic polymer. It should be appreciated that sizing with the aromatic dicyanate can be accomplished using either the monomer or soluble oligomers of the aromatic dicyanate. The purpose of sizing is to coat the interstices of the multifilament fiber and to wet the fiber with materials highly compatable with the coating to be applied. Sizing with the thermoplastic polymer alone can also be done. While the solvent for sizing may be the same as for coating, it may also be a different solvent, and especially a more volatile solvent. If aromatic dicyanate and thermoplastic polymer are both present in the sizing solution, their relative proportions may be the same or different compared to the materials used for coating; and, in particular, the sizing may contain a higher relative proportion of aromatic dicyanate.

Once the fiber has been aligned (e.g. on the roll) and dried, they can optionally be stacked (in any conventional fashion such as 0°, +45°, −45° C., 90°) and then cured. Curing of the assemblage may be conducted in a mold with pressures (e.g. 0.6–10 MPa) and temperatures (e.g. 180°–310° C.) or in an autoclave. The bagging used for curing epoxy composites in an autoclave is preferably used (but is not required) in curing an assemblage in an autoclave. To reduce loss of geometrical configuration in an autoclave or a mold, some staging requirements should be present compared to those required for high temperature epoxy composites.

The total fiber content (by volume) of the substrate of the present invention may be varied, by modifying the contact time or concentration in the coating solution, along a broad range from about 50 percent fibers to about 80 percent fibers in the substrate. The fiber content of the final molded or cured composite will generally be only slightly more than that of the prepreg. In addition, however, if a lower fiber content is desired, it is permissible to coat the same fiber with multiple passes prior to the aligning and drying steps. In such instance, it is preferred to dry the coated fiber, at least partially, between successive passes.

In the preferred embodiment, the substrate is prepared by coating a balanced polyaramid layer with a polymer solution comprising a polycyanate, preferably an aromatic dicyanate as disclosed above; a thermoplastic polymer, preferably a polyether sulfone or a poly(ester/carbonate); and a volatile solvent for the polycyanate compound and the thermoplastic polymer in which the polyaramid is substantially insoluble. The coated fiber is then dried by evaporation of the volatile solvent under conditions such that the polymerization of the polycyanate is substantially avoided. Layers of the coated polyaramid layer can be laminated together. Each substrate containing one or more layers can then be cross-linked.

The copper or other suitable conducting layer is then applied and the conducting material can be in a suitable configuration useful to form a circuit. Typically, this can be accomplished by etching the metallic, copper, layer. As shown in FIG. 1, contact points 21 can be left at leadless chip carrier locations. The leadless chip carrier 15 can then be attached by suitable means to the top surface of substrate 12 so that appropriate connections are made between the leadless chip carrier and connections 21. The leadless chip carrier is soldered directly onto the surface of the circuit board 11. Soldered connections are shown as reference character 22.

As indicated in the Background of the Invention, a problem with existing circuit boards has been the inability to match the coefficient of thermal expansion of the carrier for a leadless integrated circuit chip. Such leadless circuit chip carriers are typically made of ceramic materials such as alumina. These materials have a coefficient of expansion of $+6.4 \times 10^{-6}$ cm/cm/°C. As indicated in the article by Packard, small differences in the expansion coefficient of substrates made of polyaramid fibers and epoxy resins having an indicated coefficient of expansion of 5.1–7.1 ppm/°C. resulted in microcracks during thermal cycling. The substrate of the present invention having a polymeric or resinous layer made of a semi-IPN is not as rigid as an epoxy resin matrix. It has a high enough glass transition temperature, of greater than 80° C. and preferrably from 150° C. to 200° C., so that it maintains dimensional stability during thermal cycling. The thermoplastic aspect of the semi-IPN enables the resin matrix to have dimensional changes so that any differences in the coefficient of thermal expansion between the leadless chip carrier and the substrate can be compensated for and improve thermal crack resistance.

The example circuit board of the present invention set forth below illustrates the nature of the invention and the manner of carrying it out. However, the invention should not be considered as being limited to the details thereof. All parts are by weight unless otherwise indicated.

EXAMPLE

A circuit board of the present invention was made using a semi-IPN resin system composed of 50% by weight of poly(bis-phenyl A carbonate/terephthalate (50/50)) and 50% by weight of dicyanto-bisphenol A. The polymer mixture was dissolved as 250 g of the polymers added to one liter of dichloromethane. The solution was heated up to the boiling point of the dichloromethane for two to three hours to form the solution and cool to room temperature. A one liter bath was formed and DuPont-Kevlar 49 fabric with an areal density of 1.75 ounces/sq. yard was dipped in the solution for two minutes and turned over and redipped for two minutes. The fabric was dried at room temperature under a hood overnight and then placed in a vacuum oven at 60° C. for 4 hours. A layer of copper 0.005 inches thick was rolled onto one side. The laminate was heated up to 270° C. for ½ hour. The properties of the laminate are summarized in Table 1 below.

TABLE 1

| Property | |
|---|---|
| Flammability (UL-94) | V-1 |
| Dielectric Constant | 2.8–3.3 |
| Dissipation Factor | 0.014–0.019 |
| Surface Resistance (megohms) | $1.2 \times 10^6$ |
| Volume Resistivity (megohms/cm) | $257 \times 10^6$ |
| Arc Resistance (Seconds) | 154 |
| $T_g$ (°C.) | 212 |
| X-axis CTE ($10^{-6}$ cm/cm/°C.) $-100-+150°$ C. | 4.22 |
| Y-axis CTE ($10^{-6}$ cm/cm/°C.) $-100-+150°$ C. | 2.90 |
| Z-axis CTE ($10^{-6}$/cm/cm/°C.) | |
| 60–110° C. | 69 |
| 140–180° C. | 131 |
| 210–250° C. | 265 |

TABLE 1-continued

| Property | |
|---|---|
| TGA weight loss (%) | |
| RT–200° C. | 1.42 |
| RT–280° C. | 1.75 |

While exemplemary embodiments of the invention have been described, the true scope of the invention is to be determined from the following claims.

What is claimed is:

1. A circuit board comprising a substrate comprising at least one polymeric layer comprising a crosslinked cyanurate polymer, a thermoplastic polymer having a Tg of greater than 80° C., and at least one balanced polyaramid fibrous layer adhered to the polymeric layer, the substrate having a coefficient of thermal expansion of from 2.0 to $8.0 \times 10^{-6}$ cm/cm/°C.; and
   at least one layer of conductive material.

2. The circuit board of claim 1,
   wherein the crosslinked cyanurate polymer is formed by crosslinking an aromatic dicyanate monomer of the formula NCO-R-OCN wherein R comprises at least on aromatic moiety and contains 6–40 carbon atoms, in which the aromatic rings may be further substituted with groups inert during the crosslinking, selected from halogen, $C_1$–$C_4$ alkyl, $C_1$–$C_4$ alkoxy and $C_1$–$C_4$ alkyl carboxylic ester.

3. The circuit board of claim 1 wherein the conductive material is in a configuration which forms a circuit.

4. The circuit board of claim 1 wherein the polyaramid layer is coated with the polymeric layer.

5. The circuit board of claim 1 wherein the polyaramid layer is embedded in the polymeric layer.

6. The circuit board of claim 1 wherein the polyaramid layers is laminated to the polymeric layer.

7. The circuit board of claim 1 wherein the thermoplastic polymer is selected from the group consisting of polyethersulfone, and polycarbonate, and poly(ester carbonate).

8. The circuit board of claim 1 futher comprising at least one leadless chip carrier interconnected therewith.

9. An improved circuit board of the type having a substrate and a conducting layer wherein the improvement comprises a substrate comprising at least one polymeric layer comprising a crosslinked cyanurate polymer, a thermoplastic polymer having a Tg of greater than 80° C., and at least one balanced polyaramid layer adhered to the polymeric layer, the substrate having a coefficient of thermal expansion of from 2.0 to $8.0 \times 10^{-6}$ cm/cm/°C.

10. The circuit board of claim 9 further comprising at least one leadless chip carriers interconnected therewith.

* * * * *